(12) United States Patent
Hsu et al.

(10) Patent No.: US 7,329,939 B2
(45) Date of Patent: Feb. 12, 2008

(54) METAL-INSULATOR-METAL CAPACITOR AND METHOD OF FABRICATING SAME

(75) Inventors: Louis L. Hsu, Fishkill, NY (US); Rajiv V. Joshi, Yorktown Heights, NY (US); Chun-Yung Sung, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/205,719

(22) Filed: Aug. 17, 2005

(65) Prior Publication Data

US 2006/0014356 A1 Jan. 19, 2006

Related U.S. Application Data

(62) Division of application No. 10/643,307, filed on Aug. 19, 2003, now Pat. No. 6,964,908.

(51) Int. Cl.
*H01L 29/92* (2006.01)
(52) U.S. Cl. .............................. 257/532; 257/E29.343
(58) Field of Classification Search ............... 438/239, 438/250, 393, 957, 622, 624, 625, 639; 257/532, 257/E29.343
See application file for complete search history.

(56) References Cited

U.S. PATENT DOCUMENTS

| | | | | |
|---|---|---|---|---|
| 5,789,303 A * | 8/1998 | Leung et al. | ............... | 438/381 |
| 5,926,359 A * | 7/1999 | Greco et al. | ............... | 361/311 |
| 6,025,226 A * | 2/2000 | Gambino et al. | ........... | 438/244 |
| 6,281,541 B1 * | 8/2001 | Hu | ............... | 257/306 |
| 6,329,234 B1 | 12/2001 | Ma et al. | ............... | 438/210 |
| 6,342,734 B1 | 1/2002 | Allman et al. | ............... | 257/758 |
| 6,358,837 B1 | 3/2002 | Miller et al. | ............... | 438/622 |
| 6,426,250 B1 * | 7/2002 | Lee et al. | ............... | 438/239 |
| 6,441,419 B1 | 8/2002 | Johnson et al. | ............. | 257/296 |
| 6,451,667 B1 | 9/2002 | Ning | ............... | 438/397 |

(Continued)

OTHER PUBLICATIONS

Hang Hu, et al., *A High Performance MIM Capacitor Using HfO₂ Dielectrics*, IEEE Electron Device Letters, vol. 23, No. 9, Sep. 2002, pp. 514-516.

*Primary Examiner*—M. Wilczewski
(74) *Attorney, Agent, or Firm*—F. Chau & Associates, LLC

(57) ABSTRACT

A metal-insulator-metal (MIM) capacitor including a metal layer, an insulating layer formed on the metal layer, at least a first opening and at least a second opening formed in the first insultaing layer, a dielectric layer formed in the first opening, a conductive material deposited in the first and second openings, and a first metal plate formed over the first opening and a second metal plate formed over the second opening. A method for fabricating the MIM capacitor, includes forming the first metal layer, forming the insulating layer on the first metal layer, forming at least the first opening and at least the second opening in the first insultaing layer, depositing a mask over the second opening, forming the dielectric layer in the first opening, removing the mask, depositing the conductive material in the first and second openings, and depositing a second metal layer over the first and second openings. MIM capacitors and methods of fabricating same are described, wherein the MIM capacitors are formed simultaneously with the BEOL interconnect and large density MIM capacitors are fabricated at low cost.

13 Claims, 9 Drawing Sheets

U.S. PATENT DOCUMENTS

| | | | |
|---|---|---|---|
| 6,452,778 B1 * | 9/2002 | Leung et al. | 361/306.3 |
| 6,452,779 B1 | 9/2002 | Adler et al. | 361/306.3 |
| 6,459,562 B1 * | 10/2002 | KarRoy et al. | 361/312 |
| 6,472,721 B2 | 10/2002 | Ma et al. | 257/531 |
| 6,500,724 B1 * | 12/2002 | Zurcher et al. | 438/384 |
| 6,504,202 B1 * | 1/2003 | Allman et al. | 257/303 |
| 6,559,004 B1 * | 5/2003 | Yang et al. | 438/253 |
| 6,593,185 B1 * | 7/2003 | Tsai et al. | 438/253 |
| 6,670,237 B1 * | 12/2003 | Loh et al. | 438/253 |
| 6,706,588 B1 * | 3/2004 | Ning | 438/250 |
| 6,709,918 B1 * | 3/2004 | Ng et al. | 438/253 |
| 6,730,573 B1 * | 5/2004 | Ng et al. | 438/381 |
| 7,071,054 B2 * | 7/2006 | Park | 438/243 |
| 7,078,785 B2 * | 7/2006 | Ciancio et al. | 257/532 |
| 7,109,565 B2 * | 9/2006 | Liu et al. | 257/534 |
| 7,186,625 B2 * | 3/2007 | Chudzik et al. | 438/387 |
| 2002/0028552 A1 * | 3/2002 | Lee et al. | 438/243 |
| 2002/0155626 A1 * | 10/2002 | Park | 438/3 |
| 2003/0143322 A1 * | 7/2003 | Ning | 427/79 |
| 2003/0155603 A1 * | 8/2003 | Liu et al. | 257/309 |
| 2004/0084707 A1 * | 5/2004 | Liu et al. | 257/301 |
| 2005/0087879 A1 * | 4/2005 | Won et al. | 257/758 |
| 2005/0282346 A1 * | 12/2005 | Barth et al. | 438/303 |

* cited by examiner

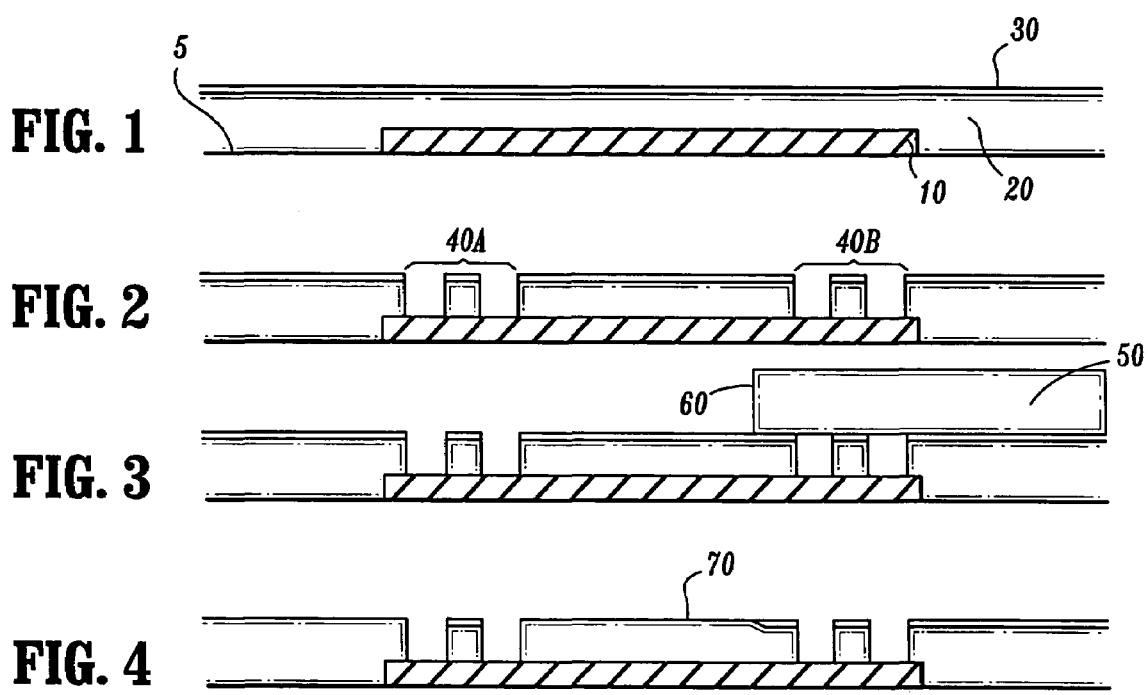

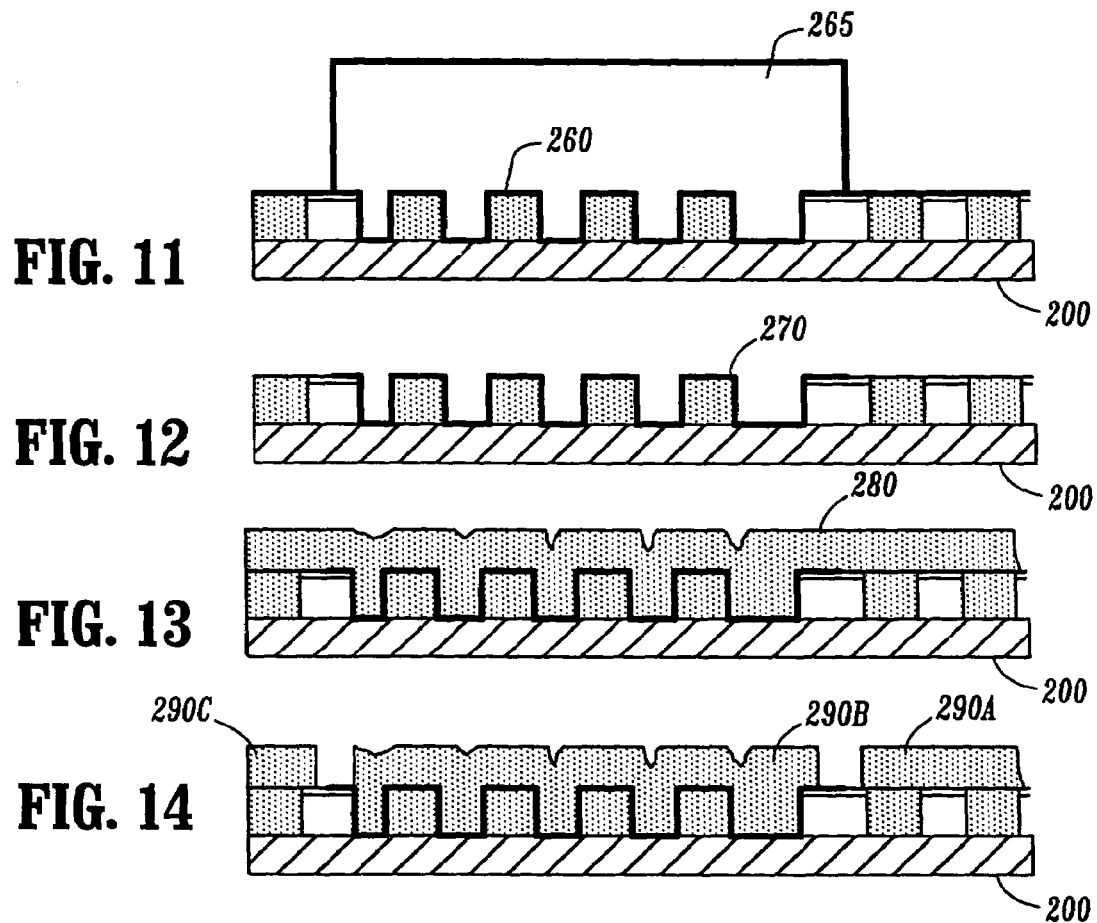

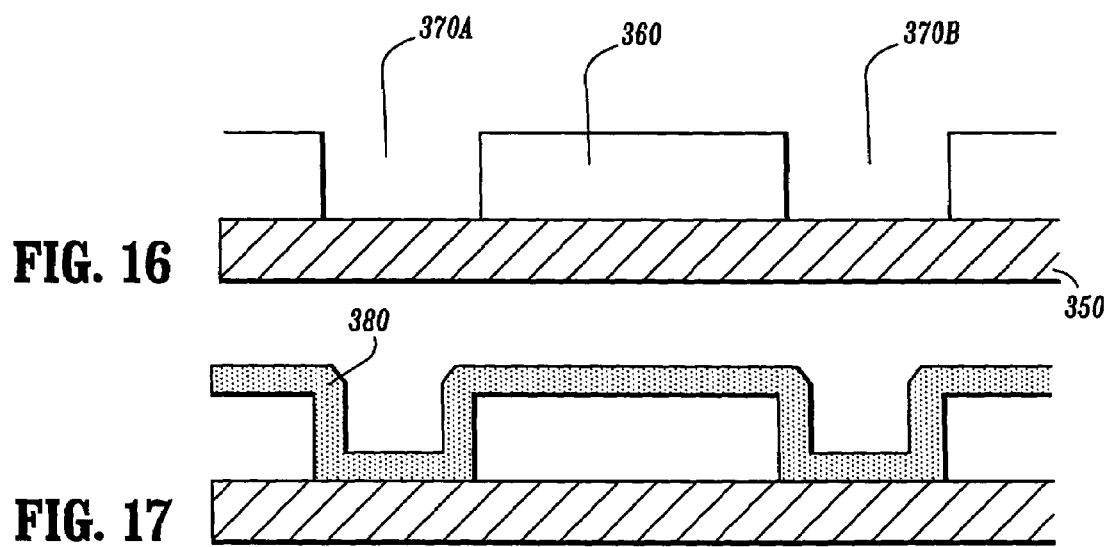

US 7,329,939 B2

METAL-INSULATOR-METAL CAPACITOR AND METHOD OF FABRICATING SAME

CROSS REFERENCE TO RELATED APPLICATION

This application is a Divisional of U.S. application Ser. No. 10/643,307 filed on Aug. 19, 2003 now U.S. Pat. No. 6,964,908, the disclosure of which in its entirety is incorporated herein by reference.

BACKGROUND OF THE INVENTION

1. Field of the Invention

The present invention relates to a metal-insulator-metal capacitor and a method of fabricating same and, more particularly, to a metal-insulator-metal capacitor incorporating metal studs or vias to increase the density thereof and reduce manufacturing costs, and a method of fabricating same.

2. Description of the Related Art

Contemporary integrated circuit design demands large capacitors having high density to meet the needs of higher density integrated circuits. Capacitors may be used for a number of functions, including, for example, as a reservoir capacitor for a charge pump circuit or for noise decoupling.

Some known high density capacitors use a metal-insulator-metal (MIM) structure. MIM capacitors are valuable components in memory, logic and analog circuits. Some MIM capacitors are bulky planar devices introduced into integrated circuits at the back-end-of-line (BEOL) and require dielectric materials with low processing temperatures. The dielectric materials may include $SiO_2$ or $Si_3N_4$ deposited using plasma enhanced chemical vapor deposition (PECVD) and have capacitance densities ranging from about 1 to 1.5 $fF/\mu m^2$. These capacitors, referred to as horizontal plate capacitors, demand large chip area. U.S. Pat. No. 5,926,359 to Greco et al., for example, relates to a known horizontal plate capacitor.

The ongoing scaling of very large scale integration (VLSI) circuits requires a reduction of the planar area allocated to an MIM capacitor while maintaining the capacitance requirements. Thickness scaling of current materials has resulted in problems such as increases in leakage current and voltage linearity, and a reduction in lifetime reliability of thinner films.

Building capacitors in the vertical direction is a known method of reducing the amount of chip area occupied by a capacitor. For example, a capacitor may be formed on the sidewalls and the bottom of a deep trench structure. See, e.g., U.S. Pat. No. 6,358,837 to Miller et al. According to known methods, the trenches are formed at the BEOL due to requirements of low temperature metal processing to avoid melting of the electrodes. However, in some instances, it has been suggested to form deep trenches in a silicon substrate and to form the electrodes with doped polysilicon or a metal having a high melting point, such as tungsten. A problem with the use of deep trenches is high processing costs.

As an alternative to deep trenches, another vertical MIM capacitor utilizing a shallow trench structure, has been proposed. See, e.g., U.S. Pat. No. 6,329,234 to Ma et al. The shallow trench is formed by etching insulating material in the BEOL. Capacitors formed in the shallow trench structure have been referred to as semi-interdigitated MIM capacitors. A problem with the semi-interdigitated MIM capacitor is that the surface efficiency may be only 50-60%, which means that the semi-interdigitated MIM capacitor does not allow all the nodes to couple at all surfaces.

Reduction in available area has also led to the introduction of alternative high dielectric constant materials such as $Al_2O_3$, $Ta_2O_5$, $HfO_2$ and laminate stacks thereof. See Hu, H., IEEE Elect. Dev. Lett., Vol. 23, No. 9, 2002. The introduction of the alternative materials may require integration processing, such as reactive ion etching (RIE) to pattern the MIM capacitor area. In some cases, the RIE patterning of the alternative materials requires plasma etching at elevated temperatures and/or a dual step process of plasma etching followed by a wet chemical etch. Such processing required when using the alternative materials increases manufacturing costs. For example, HfO2 is a material that is difficult to etch. See Sematech, "FEP Surface Preparation", Monthly Report, December, 2002.

Therefore, there exists a need for a low-cost MIM capacitor and method of fabricating same, which can increase capacitor density and utilize some of the existing semiconductor processing steps so as to reduce integration cost.

BRIEF SUMMARY OF THE INVENTION

A method for fabricating a metal-insulator-metal capacitor, in accordance with the present invention, includes forming a first metal layer, forming a first insulating layer on the first metal layer, forming at least a first opening and at least a second opening in the first insultaing layer, depositing a mask over the second opening, forming a first dielectric layer in the first opening, removing the mask, depositing a first conductive material in the first and second openings, depositing a second metal layer over the first and second openings.

In alternate embodiments, the method may include forming a polish stop layer on the first insulating layer and performing chemical mechanical polishing on the conductive material. The first and second openings may be formed by etching the insulating layer down to the first metal layer. The second metal layer may consist of a first plate formed over the first opening and a second plate formed over the second opening. The first and second metal layers may be formed from one of aluminum, cooper and tungsten. The mask may be formed from one of a polymer or resist material. The first conductive material may be formed from one of aluminum, cooper and tungsten. The first dielectric layer may be formed from one of chemical vapor deposition oxide and chemical vapor deposition nitride. The method may also include forming a second insulating layer on the second metal layer, forming at least a third opening and at least a fourth opening in the second insultaing layer, forming a second dielectric layer in the third opening, depositing a second conductive material in the third and fourth openings, and forming a third metal layer over the third and fourth openings.

Another method for fabricating a metal-insulator-metal capacitor, in accordance with the present invention includes forming a first metal layer, forming an insulating layer on the first metal layer, forming at least a first via and at least a second via in the insulting layer and on the first metal layer, depositing a mask over the second via and a predetermined portion of the insulating layer, etching an exposed area of the insulating layer down to the first metal layer, removing the mask, forming a dielectric layer on a remaining area after etching and removal of the mask, selectively removing a predetermined portion of the dielectric layer, and depositing a second metal layer over the first and second vias.

In alternate embodiments, the first and second vias may include conductive material deposited therein, a predetermined portion of the dielectric layer may cover at least the second via, and the second metal layer may be patterned to form a first plate over the first via and a second plate over the second via.

Another method for fabricating a metal-insulator-metal capacitor, in accordance with the present invention, includes forming a first metal layer, forming an insulating layer on the first metal layer, forming at least a first opening and at least a second opening in the insultaing layer, depositing a sidewall liner material on the insulating layer and in the first and second openings, removing a predetermined portion of the sidewall liner material to form spacers on each sidewall of the first and second openings, forming a dielectric layer on the insulating layer, and on the spacers and exposed portions of the first metal layer in the first and second openings, depositing a mask over the first opening; removing the dielectric layer from the second opening, filling the second opening with a conductive material, and depositing a second metal layer over and in the first opening and over the second opening including the conductive material.

In alternate embodiments, the first and second openings may be formed by etching the insulating layer down to the first metal layer, the sidewall liner material may be TiN, and the step of removing a predetermined portion of the sidewall liner material may be performed by etching the sidewall liner material. The step of removing the dielectric layer may be performed by selective etching and the conductive material may be tungsten. The method may further include patterning the second metal layer to form a first plate over and in the first opening and a second plate over the second opening including the conductive material.

A metal-insulator-metal capacitor, in accordance with the present invention includes a metal layer, an insulating layer formed on the metal layer, at least a first opening and at least a second opening formed in the first insultaing layer, a dielectric layer formed in the first opening, a conductive material deposited in the first and second openings, and a first metal plate formed over the first opening and a second metal plate formed over the second opening.

In alternate embodiments, the metal-insulator-metal capacitor may include a polish stop layer formed on the insulating layer and the metal layer and the first and second metal plates may be formed from one of aluminum, copper and tungsten. The conductive material may be formed from one of aluminum, copper and tungsten and the dielectric layer may be formed from one of chemical vapor deposition oxide and chemical vapor deposition nitride.

Another metal-insulator-metal capacitor, in accordance with the present invention, includes a metal layer, an insulating layer formed on the metal layer, at least a first via and at least a second via formed in the insulting layer and on the metal layer, a dielectric layer formed on the first via and on an exposed area of the metal layer, and a first metal plate formed over the first via and a second metal plate formed over the second via.

In alternate embodiments, the first and second vias may include conductive material deposited therein and the metal-insulator-metal capacitor may further include a polish stop layer formed on the insulating layer.

Another metal-insulator-metal capacitor, in accordance with the present invention, includes a metal layer, an insulating layer formed on the metal layer, at least a first opening and at least a second opening formed in the insultaing layer, spacers formed on each sidewall of the first and second openings, a dielectric layer lining the spacers and bottom wall of the first opening, a conductive material deposited in the second opening, and a first metal plate formed over and in the first opening and a second metal plate formed over the second opening including the conductive material.

In alternate embodiments, the spacers may be formed of TiN and the conductive material may be tungsten.

Another method for fabricating a metal-insulator-metal capacitor, in accordance with the present invention, includes forming at least a first via for incorporation into the metal-insulator-metal capacitor, and forming, simultaneously with formation of the first via, at least a second via for incorporation into a BEOL interconnect.

A method for fabricating a semiconductor device, in accordance with the present invention, includes forming at least one metal-insulator-metal capacitor, and forming, simultaneously with formation of the at least one metal-insulator-metal capacitor, at least one BEOL interconnect.

BRIEF DESCRIPTION OF THE DRAWINGS

Preferred embodiments of the invention can be understood in more detail from the following descriptions taken in conjunction with the accompanying drawings in which:

FIGS. 1-7 illustrate a method of fabricating an MIM capacitor according to a first embodiment of the present invention;

FIGS. 8-14 illustrate a method of fabricating an MIM capacitor according to a second embodiment of the present invention;

FIGS. 16-23 illustrate a method of fabricating an MIM capacitor according to a third embodiment of the present invention.

DETAILED DESCRIPTION OF THE PREFERRED EMBODIMENTS

Figure 5:

Preferred embodiments of the present invention will be described below in more detail with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art.

Referring now to the drawings, FIGS. 1-7 illustrate a method of fabricating an MIM capacitor according to a first embodiment of the present invention. Referring to FIGS. 1-7, a first metal layer 10 is deposited on a semiconductor substrate 5 and patterned. The metal may be, for example, aluminum (Al), copper (Cu) or tungsten (W). An insulating layer 20 is deposited on the substrate 5 including the first metal layer 10. The insulating layer 20, which may be formed from chemical vapor deposition (CVD) oxide, is then planarized. A dielectric layer, or polish stop layer 30, preferably formed from CVD nitride is then deposited on the insulating layer 20.

Using a mask (not shown), the stop layer 30 and the insulating layer 20 are patterned and etched down to the first metal layer 10 to form openings 40A and 40B. Etching is performed using, for example, $Cf_4/O_2$ plasma. The openings 40A and 40B will be used to form metal studs or vias in the insulating and stop layers 20, 30. The vias can provide an electrical pathway from one metal layer to another metal layer and increase the surface area of an MIM capacitor. The vias formed in the openings 40A may be used for the MIM capacitor and the vias formed in the openings 40B may be used to form a BEOL interconnect. Interconnects may, for example, carry electrical signals to different parts of the die, connect elements of an integrated circuit or form a multilevel network.

As shown in FIG. 3, a mask 50 is deposited on the stop layer 30 over the region 40B. The mask 50 may be formed of, for example, polymer or resist material. A thin capacitor dielectric layer 60 is deposited on the mask 50, the stop layer 30 and etched region 40A. As shown in FIG. 4, the mask 50 is then stripped away leaving a defined dielectric layer 70. Alternatively, a blanket dielectric layer 60 can be deposited on the stop layer 30 and regions 40A and 40B and, subsequently, unwanted portions of the blanket dielectric layer 60 (i.e., those portions in and adjacent to the region 40B) may be removed using a block-out mask (not shown).

Figure 6:
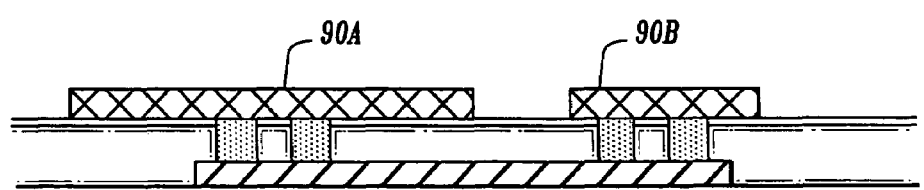
Figure 7:
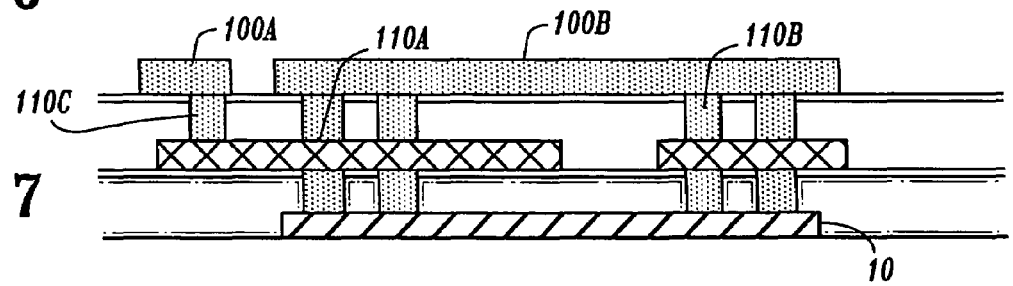
Figure 7A:
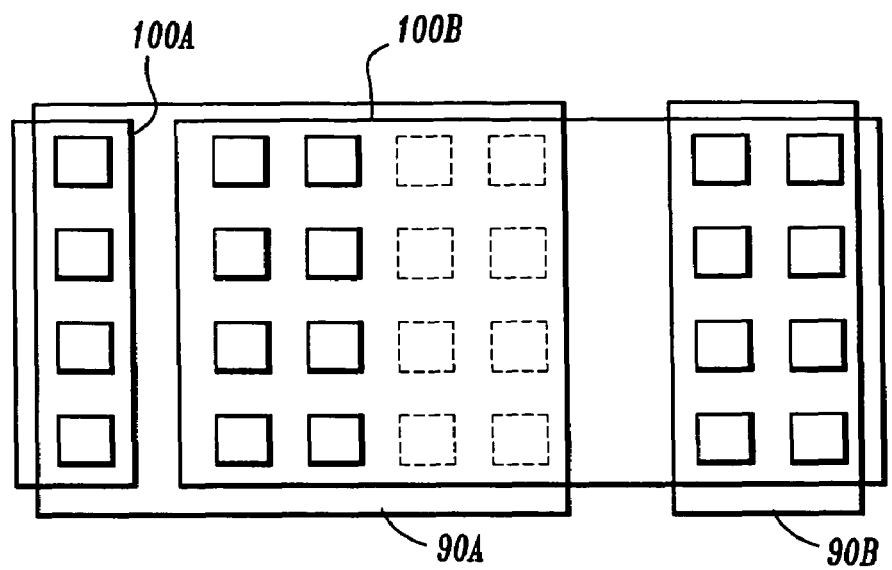
FIG. 7A is a top view of an MIM capacitor according to a first embodiment of the present invention.
Figure 7B:
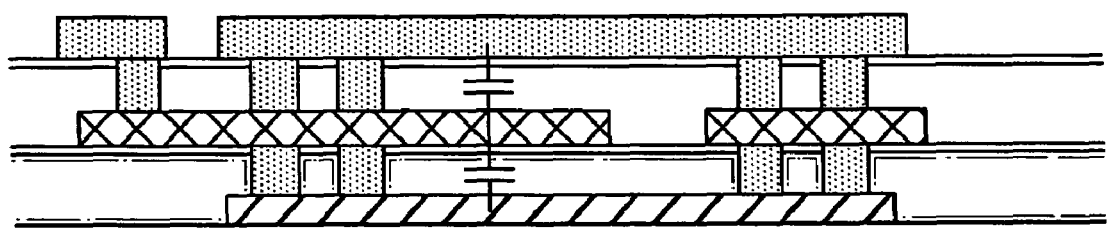
FIG. 7B is a cross-sectional view of an MIM capacitor according to a first embodiment of the present invention.

As shown in FIG. 5, vias 80A and 80B are simultaneously formed in the openings 40A and 40B, respectively, by depositing conductive material, such as tungsten, therein and performing chemical mechanical polishing (CMP) on the deposited material. As shown in FIG. 6, the top plates 90A and 90B of the MIM capacitor and the interconnect, respectively, are formed over respective vias 80A and 80B. The top metal plates 90A and 90B are preferably formed from aluminum, copper or tungsten, and are formed by material deposition, patterning and etching. For example, $Cl_2O_2$ plasma, without an etch-stop, may be used to pattern aluminum and a damascene process using CMP and an etch-stop may be used to pattern copper. As shown in FIG. 7, the MIM capacitor and interconnects can be simultaneously and continuously fabricated in a multi-layer structure by, for example, forming vias 110A, 110B and 110C and forming metal plates 100A and 100B over the vias 110C and 110A and 110B, respectively. In accordance with the structure shown in FIG. 7, a first capacitor node can be contacted through metal plate 100A and a second capacitor node formed by the first metal layer 10 and the metal plate 100B can be contacted through metal plate 100B. The multi-layer structure may consist of more or less than three levels of metals, depending on the desired density of the MIM capacitor. FIGS. 7A and 7B show corresponding top and cross-sectional views, respectively, of the MIM capacitor formed according to a first embodiment of the present invention. The capacitor area of the MIM capacitor according to the first embodiment includes the bottom of the vias 80A and 110A. The following embodiment provides for increased capacitor area, which includes the sides of the vias.

Figure 8:
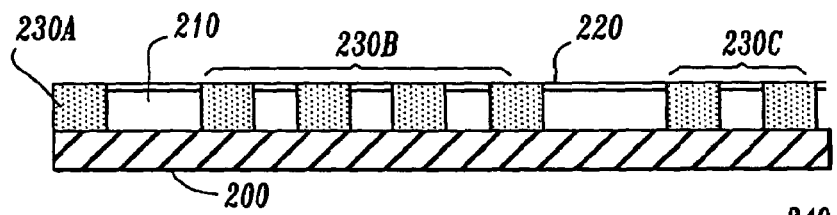
Figure 9:
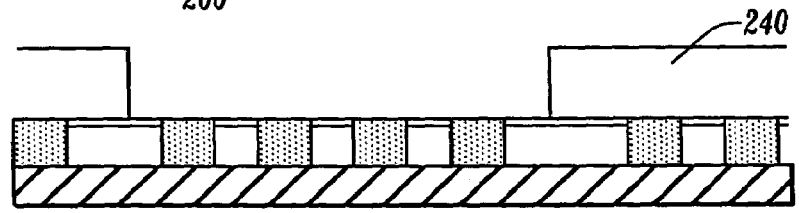
Figure 10:
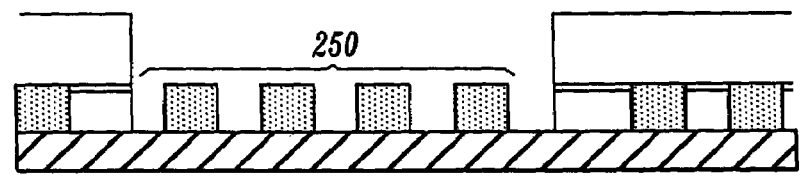

FIGS. 8-14 illustrate a method of fabricating an MIM capacitor according to a second embodiment of the present invention. Referring to FIGS. 8-14, vias 230A, 230B and 230C are formed prior to removing select layers in the region 250 where the MIM capacitor is to be formed. As shown in FIG. 8, a first metal layer 200 includes an insulating layer 210 formed thereon and vias 230A, 230B and 230C formed in predetermined areas of the insulating layer 210. A CMP polish stop layer 220 is formed on the insulating layer 210. The vias 230B are for the MIM capacitor and the vias 230A and 230C will form the interconnect. As shown in FIG. 9, a mask 240 formed of, for example, polymer or resist material, is positioned on the stop layer 220 over the vias 230A and 230C. As shown in FIG. 10, after the vias 230A, 230B and 230C have been formed, the exposed areas of the stop layer 220 and the insulating layer 210 are etched, using the mask 240, down to the first metal layer 200 to form the MIM capacitor region 250. Etching may be performed with $Cf_4/O_2$ plasma. The vias 230A, 230B and 230C may be formed in the same manner as shown in FIGS. 1-5 of the first embodiment.

As shown in FIGS. 11-12, after the mask 240 is removed, a capacitor dielectric layer 260 is deposited on the resultant structure and selectively removed from predetermined areas using a mask 265, so as to form a defined dielectric layer 270. Referring to FIGS. 13-14, a second metal layer 280, for example, aluminum, copper or tungsten, is deposited on the resultant structure and is patterned to form the top metal plate 290B of the MIM capacitor and the contacts 290A and 290C to the first metal layer 200. For example, $Cl_2O_2$ plasma, without an etch-stop, may be used to pattern aluminum and a damascene process using CMP and an etch-stop may be used to pattern copper.

Figure 15:
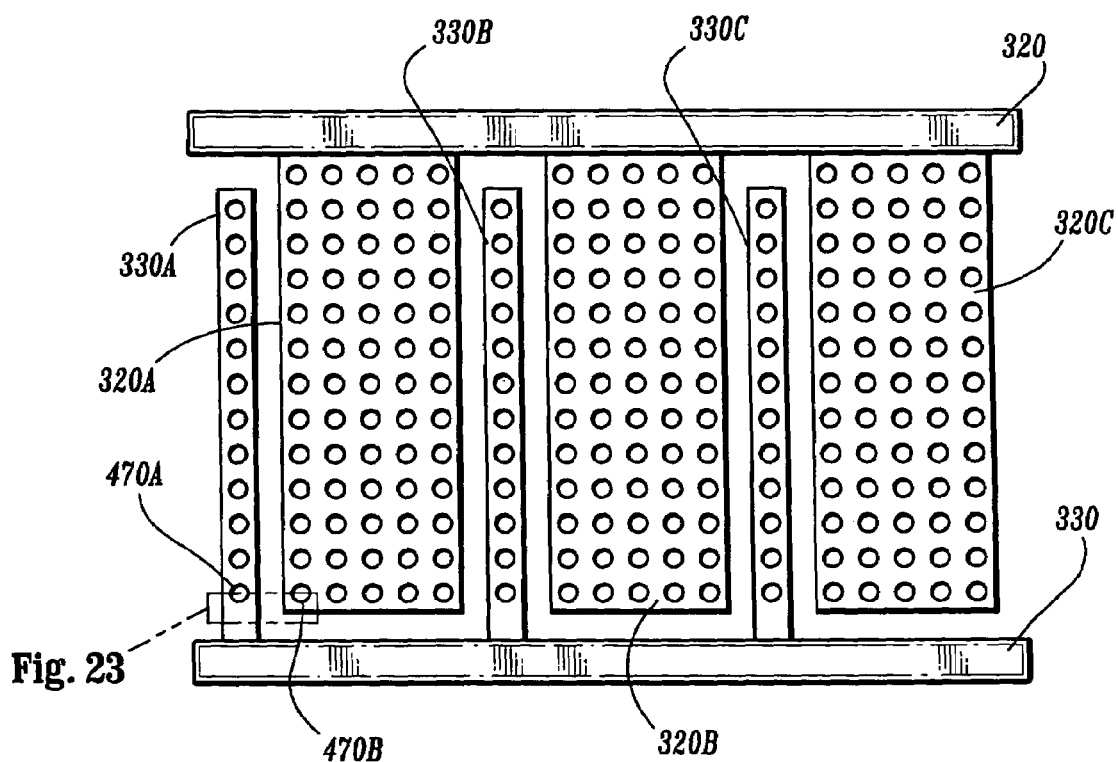
FIG. 15 is a top view of an MIM capacitor according to a third embodiment of the present invention.
Figure 21:
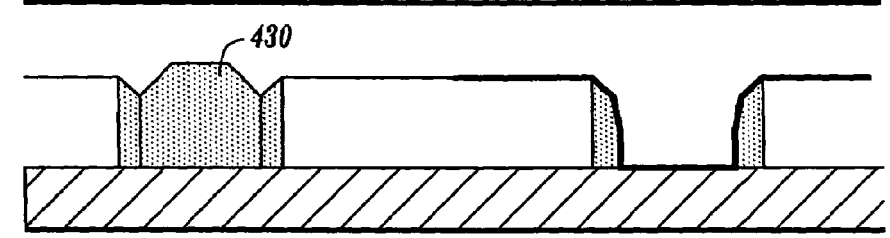
Figure 22:
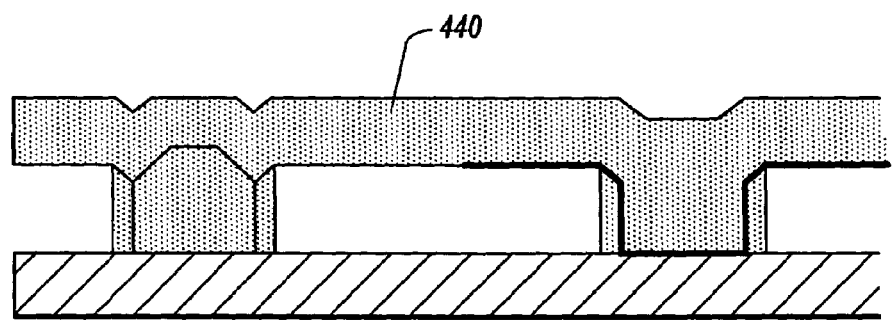
Figure 23:
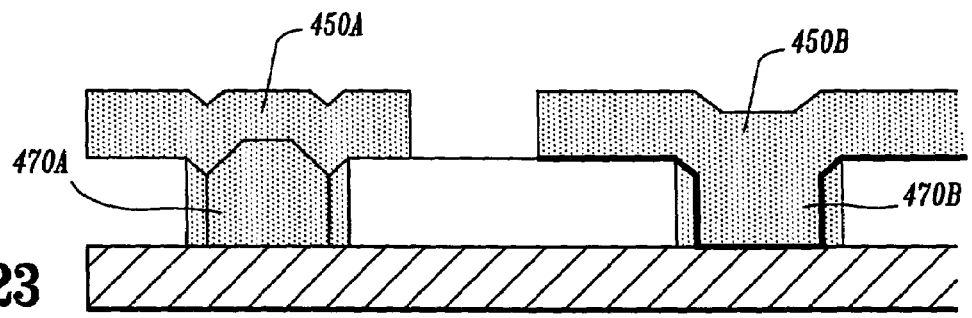

FIG. 15 shows a top view of an MIM capacitor according to a third embodiment of the present invention, and FIGS. 16-23 illustrate a method of fabricating an MIM capacitor according to a third embodiment of the present invention, wherein FIG. 23 is a cross-section of the dashed box outlined in FIG. 15. As shown in FIG. 15, metal 320 is connected to a first node of the MIM capacitor formed by 320A, 320B and 320C. Similarly, metal 330 is connected to a second node of the MIM capacitor formed by 330A, 330B and 330C. Referring to FIGS. 15 and 23, the MIM capacitor is formed by vias 470B and the contacts are established through vias 470A.

As shown in FIG. 16, an insulating layer 360 is deposited on a first metal layer 350. The insulating layer 360 is patterned and etched down to the first metal layer 350 to form openings 370A and 370B, which will be formed into respective contact and MIM capacitor vias. Etching is performed using, for example, $Cf_4/O_2$ plasma. As shown in FIG. 17, sidewall liner material 380, such as TiN, is deposited on the insulating layer 360 and into the openings 370A and 370B. As shown in FIG. 18, etching of the sidewall liner material 380 is performed to remove excess liner material 380 and to form spacers 390 on the sidewalls of the openings 370A and 370B. The sidewall liner material 380 may be wet etched using hydrogen peroxide ($H_2O_2$) or SC1. The sidewall liner material may be dry etched using $Cl_2$ or $BCl_3$. The spacers 390 are used in opening 370A for the interconnect and extend the area of the MIM capacitor from the bottom to the sidewalls of the opening 370B.

Figure 19:
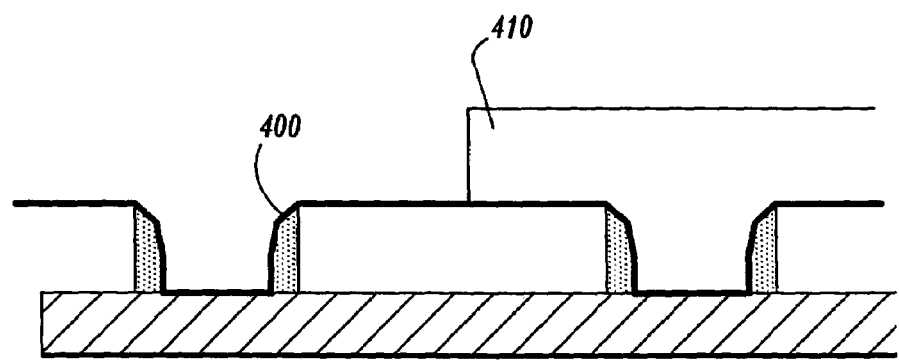
Figure 20:
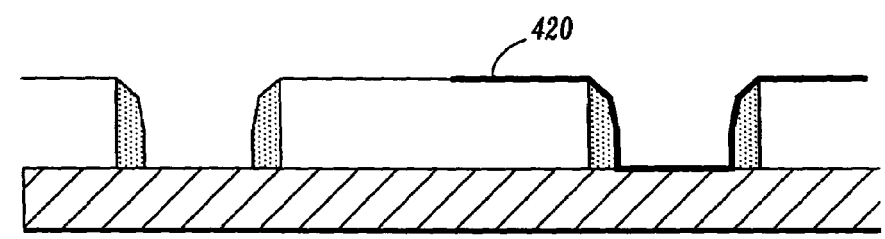

As shown in FIG. 19, a thin capacitor dielectric layer 400, formed of, for example, CVD oxide or CVD nitride, is deposited on the resultant structure followed by the formation of a mask 410 over the opening 370B and the adjacent area. The mask 410 may be formed of, for example, polymer or resist material. As shown in FIG. 20, the dielectric layer 400 not covered by the mask 410 is removed by selective etching. Referring to FIG. 21, following selective etching, selective tungsten deposition is performed to fill the opening 370A in the contact region 430. Due to selectivity, tungsten will not grow inside the opening 370B and any extra tungsten residue may become part of the top plate 450A.

As shown in FIGS. 22-23, a second metal layer 440A, preferably formed of aluminum, copper or tungsten, is deposited on the resultant structure and patterned to form top plate 450B of the MIM capacitor and top plate 450A of the contact to the first metal layer 350. For example, $Cl_2O_2$ plasma, without an etch-stop, may be used to pattern aluminum and a damascene process using CMP and an etch-stop may be used to pattern copper. Vias 470A and 470B relate to the contact and MIM capacitor, respectively.

In sum, the present invention provides MIM capacitors and methods of forming same, wherein the MIM capacitors are formed simultaneously with the BEOL interconnect and large density MIM capacitors are fabricated at low cost.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claim is:

1. A metal-insulator-metal capacitor and an interconnect, comprising:
   a metal layer, wherein the metal layer is continuous in m the capacitor to the interconnect and functions as both a bottom plate of the capacitor and a metal contact of the interconnect;
   an insulating layer formed on the metal layer;
   a polish stop layer formed on the insulating layer;
   at least a first opening and at least a second opening formed in the insulating layer, wherein the first opening corresponds to the capacitor and the second opening corresponds to the interconnect;
   a dielectric layer formed in the first opening;
   a conductive material deposited in the first and second openings
   a first metal plate formed on the insulating layer including the polish stop layer and over the first opening and a second metal plate formed over the second opening.

2. The metal-insulator-metal capacitor and the interconnect as recited in claim 1, wherein the metal layer end the first and second metal plates are formed from one of aluminum, copper and tungsten.

3. The metal-insulator-metal capacitor and the interconnect as recited in claim 1, wherein the conductive material is formed from one of aluminum, copper and tungsten.

4. The metal-insulator-metal capacitor and the interconnect as recited in claim 1, wherein the dielectric layer is formed from one of chemical vapor deposition oxide and chemical vapor deposition nitride.

5. A metal-insulator-metal capacitor and an interconnect, comprising:
   a metal layer, wherein the metal layer is continuous from the capacitor to the interconnect and functions as both a bottom plate of the capacitor and a metal contact of the interconnect;
   an insulating layer formed on the metal layer;
   a polish stop layer formed on the insulating layer;
   at least a first via and at least a second via formed in the insulating layer and on the metal layer, wherein the first via corresponds to the capacitor and the second via corresponds to the interconnect;
   a dielectric layer formed on the first via and on an exposed area of the metal layer; and
   a first metal plate formed over the first via and a second metal plate formed on the insulating layer including the polish stop layer and over the second via.

6. The metal-insulator-metal capacitor and the interconnect as recited in claim 5, wherein the first and second vias include conductive material deposited therein.

7. The metal-insulator-metal capacitor and the interconnect as recited in claim 5, wherein the metal layer and the first and second metal plates are formed from one of aluminum, copper and tungsten.

8. The metal-insulator-metal capacitor and the interconnect as recited in claim 5, wherein the dielectric layer is formed from one of chemical vapor deposition oxide and chemical vapor deposition nitride.

9. A metal-insulator-metal capacitor and an interconnect, comprising:
   a metal layer;
   an insulating layer formed on the metal layer;
   at least a first opening and at least a second opening formed in the insulating layer;
   spacers formed on each sidewall of the first and second openings;
   a dielectric layer lining the spacers and bottom wall of the first opening;
   a conductive material deposited in the second opening; and
   a first metal plate formed over and in the first opening and a second metal plate formed over the second opening including the conductive material.

10. The metal-insulator-metal capacitor and the interconnect as recited in claim 9, wherein the spacers are formed of TiN.

11. The metal-insulator-metal capacitor and the interconnect as recited in claim 9, wherein the conductive material is formed from one of aluminum, cooper and tungsten.

12. The metal-insulator-metal capacitor and the interconnect as recited in claim 9, wherein the metal layer and the first and second metal plates are formed from one of aluminum, copper and tungsten.

13. The metal-insulator-metal capacitor and the interconnect as recited in claim 9, wherein the dielectric layer is formed from one of chemical vapor deposition oxide and chemical vapor deposition nitride.

* * * * *